United States Patent
Nakamura et al.

(10) Patent No.: US 7,579,746 B2
(45) Date of Patent: Aug. 25, 2009

(54) ACTUATOR WITH ALTERNATING STEADY VOLTAGE COMBS AND VARIABLE VOLTAGE COMBS

(75) Inventors: Tomoaki Nakamura, Suwa (JP); Makoto Inoguchi, Nishitokyo (JP)

(73) Assignee: Seiko Epson Corporation (JP)

( * ) Notice: Subject to any disclaimer, the term of this patent is extended or adjusted under 35 U.S.C. 154(b) by 579 days.

(21) Appl. No.: 11/348,788

(22) Filed: Feb. 7, 2006

(65) Prior Publication Data

US 2006/0227553 A1   Oct. 12, 2006

(30) Foreign Application Priority Data

| Mar. 23, 2005 | (JP) | ............................. 2005-083865 |
| Mar. 30, 2005 | (JP) | ............................. 2005-098069 |
| Oct. 18, 2005 | (JP) | ............................. 2005-303002 |

(51) Int. Cl.
*H02N 1/00* (2006.01)
*G02B 26/08* (2006.01)

(52) U.S. Cl. ..................... 310/309; 359/224; 359/225; 359/291

(58) Field of Classification Search ............... 310/309; 359/223–226, 290, 291
See application file for complete search history.

(56) References Cited

U.S. PATENT DOCUMENTS

| 5,963,367 | A | * | 10/1999 | Aksyuk et al. .............. 359/392 |
| 6,133,670 | A | | 10/2000 | Rodgers |
| 6,853,517 | B2 | | 2/2005 | Hirano |
| 7,034,370 | B2 | * | 4/2006 | Kuo .......................... 257/414 |
| 7,185,994 | B2 | * | 3/2007 | Ko et al. ..................... 359/872 |
| 2004/0155556 | A1 | | 8/2004 | Onoda |
| 2006/0227553 | A1 | * | 10/2006 | Nakamura et al. ......... 362/286 |

FOREIGN PATENT DOCUMENTS

| CN | 1534610 | 10/2004 |
| JP | 2004-301865 | 10/2004 |

* cited by examiner

*Primary Examiner*—Karl I Tamai
(74) *Attorney, Agent, or Firm*—Harness, Dickey & Pierce, P.L.C.

(57) ABSTRACT

An actuator includes: a base section; an object having a body portion and a holding portion holding the body portion in a manner that the body portion is movable against the base section; a movable comb-tooth portion extending from the object side in a direction substantially perpendicular to a formation direction of the holding portion; and a fixed comb-tooth portion which extends from the base section in a direction substantially perpendicular to the formation direction of the holding portion and which is arranged at a position at which the fixed comb-tooth portion is engaged with but having a gap from the movable comb-tooth portion; the fixed comb-tooth portion being composed of a steady-voltage-receiving fixed comb tooth that steadily supplies a drive voltage and a variable-voltage-receiving fixed comb tooth that receives a controlled voltage.

12 Claims, 10 Drawing Sheets

ACTUATOR WITH ALTERNATING STEADY VOLTAGE COMBS AND VARIABLE VOLTAGE COMBS

BACKGROUND

1. Technical Field

The present invention relates to an actuator that drives an object such as a mirror, an optical device having the actuator, and a method for manufacturing the actuator.

2. Related Art

For a microelectro mechanical system (MEMS) device, a mirror device is used, for example. To rotate this device, it is necessary to use an actuator. For an actuator of this kind, a parallel flat plate actuator and an electromagnetic actuator have been used. However, the parallel flat plate actuator has a disadvantage in that the drive torque becomes very small when the movable plate is set apart from the electrode plate and that not enough deflection angle can be obtained when the movable plate and the electrode plate are set close to each other in order to increase the drive torque.

Regarding the electromagnetic actuator, although the drive force is large, there is a disadvantage in that it requires wires to flow electric current to the structure, that heat is generated due to the flow of current, and that the device size increases since a permanent magnet is provided therewith.

As a substitution for such actuators, a perpendicular comb-tooth actuator is recently receiving attention. The perpendicular comb-tooth actuator is an electrostatic attraction type actuator as is the parallel flat plate actuator. However, because the perpendicular comb-tooth actuator can have a high driving torque, have no restriction on the deflection angle, have a much simpler structure than that of the electromagnetic actuator, and is thus easier to manufacture, a number of research developments and reports have been made on the MEMS device equipped with the perpendicular comb-tooth actuator. For example, JP-A-2004-301865 (p. 1, FIGS. 1 and 2) proposes this type of an actuator.

However, the actuator depicted in the referenced document has the following problem. That is, when a movable comb-teeth shaped structure is coupled to a plus side and a fixed comb-teeth shaped structure is coupled to a minus side to give a potential difference between the two, the movable comb-teeth shaped structure is attracted to the fixed comb-teeth shaped structure by electrostatic attraction. This generates a torsional moment on the torsion bar, and the movable plate produces a displacement angle against the support substrate. Because it is simply that the plus voltage is applied to the movable comb-teeth shaped structure and the minus voltage is applied to the fixed comb-teeth shaped structure, the drive force for driving the movable plate cannot be arbitrarily adjusted, and, thus, the movable plate cannot be freely controlled.

SUMMARY OF THE INVENTION

An advantage of the present invention is to provide an actuator that can solve these problems and control operations of an object such as a mirror by an arbitrary drive force, an optical device having the actuator, and a method for manufacturing the actuator.

According to one aspect of the invention, an actuator includes: a base section; an object having a body portion and a holding portion holding the body portion in a manner that the body portion is movable against the base section; a movable comb-tooth portion extending from the object side in a direction substantially perpendicular to a formation direction of the holding portion; and a fixed comb-tooth portion which extends from the base section in a direction substantially perpendicular to the formation direction of the holding portion and which is arranged at a position at which the fixed comb-tooth portion is engaged with but having a gap from the movable comb-tooth portion; the fixed comb-tooth portion being composed of a steady-voltage-receiving fixed comb tooth that steadily receives a drive voltage and a variable-voltage-receiving fixed comb tooth that receives a controlled voltage.

In this case, the object includes the body portion and the holding portion holding the body portion in a manner that the body portion is movable against the base section. The movable comb-tooth portion extends from the object side in a direction substantially perpendicular to the formation direction of the holding portion. The fixed comb-tooth portion extends from the base section in a direction substantially perpendicular to the formation direction of the holding portion and is arranged at a position at which the fixed comb-tooth portion is engaged with but having a gap from the movable comb-tooth portion.

The fixed comb-tooth portion is composed of the steady-voltage-receiving fixed comb tooth and the variable-voltage-receiving fixed comb tooth. The steady-voltage-receiving fixed comb tooth is a comb tooth that steadily receives the drive voltage. The variable-voltage-receiving fixed comb tooth is a comb tooth that receives a controlled voltage.

Consequently, by supplying the controlled voltage to the variable-voltage-receiving fixed comb tooth while steadily supplying the drive voltage to the steady-voltage-receiving fixed comb tooth, the movable comb-tooth portion may be attracted to the fixed comb-tooth portion by the electrostatic attraction, and, since the voltage is controlled when supplied, the drive force to be applied to the object and the movable comb-tooth portion may be freely controlled.

It is preferable that the movable comb-tooth portion is formed extending from the body portion in order to move the body portion of the object two-dimensionally and that the fixed comb-tooth portion is arranged at a position at which the fixed comb-tooth portion is engaged with but having a gap from the movable comb-tooth portion.

In this case, the movable comb-tooth portion is formed extending from the body portion in order to move the body portion of the object two-dimensionally. The fixed comb-tooth portion is arranged at the position at which the fixed comb-tooth portion is engaged with but having a gap from the movable comb-tooth portion.

Consequently, the body portion of the object and the movable comb-tooth portion may be two-dimensionally moved by the electrostatic attraction.

It is preferable that the movable comb-tooth portion is formed extending from the holding portion in order to move the body portion of the object two-dimensionally and that the fixed comb-tooth portion is arranged at a position at which the fixed comb-tooth portion is engaged with but having a gap from the movable comb-tooth portion.

In this case, the movable comb-tooth portion is formed extending from the holding portion in order to move the body portion of the object two-dimensionally. The fixed comb-tooth portion is arranged at the position at which the fixed comb-tooth portion is engaged with but having a gap from the movable comb-tooth portion.

As a consequence, the body portion of the object and the movable comb-tooth portion may be two-dimensionally moved by the electrostatic attraction.

It is preferable that the movable comb-tooth portion is formed extending from the body portion in order to move the body portion of the object two-dimensionally, that another movable comb-tooth portion is formed extending from the holding portion in order to rotate the object around the holding portion of the object, and that the fixed comb-tooth portion is arranged at a position at which the fixed comb-tooth portion is engaged with but having a gap from the movable comb-tooth portion.

In this case, the movable comb-tooth portion is formed extending from the body portion in order to move the body portion of the object two-dimensionally. Further, another movable comb-tooth portion is formed extending from the holding portion in order to rotate the object around the holding portion of the object. The fixed comb-tooth portion is arranged at the position at which the fixed comb-tooth portion is engaged with but having a gap from the movable comb-tooth portion.

As a consequence, the body portion of the object and the movable comb-tooth portion may be two-dimensionally moved by the electrostatic attraction. The body portion of the object and the movable comb-tooth portion may be rotated around the holding portion of the object by a rotational force.

It is preferable that at least one steady-voltage-receiving fixed comb tooth and at least one variable-voltage-receiving fixed comb tooth are alternately aligned with a gap therebetween.

In this case, at least one steady-voltage-receiving fixed comb tooth and at least one variable-voltage-receiving fixed comb tooth are alternately aligned with a gap therebetween.

Consequently, even when the controlled voltage is supplied to the variable-voltage-receiving fixed comb tooth, the electrostatic attraction can be generated uniformly as a whole between the fixed comb-tooth portion and the movable comb-tooth portion.

It is preferable that a direct current voltage is applied to the variable-voltage-receiving fixed comb tooth.

In this case, a direct current voltage is applied to the variable-voltage-receiving fixed comb tooth.

Accordingly, only by applying the direct current voltage to the variable-voltage-receiving fixed comb tooth, the value of the electrostatic attraction between the movable comb-tooth portion and the fixed comb-tooth portion may be finely adjusted, and a fine control of the drive force of the body portion of the object may be reliably conducted.

It is preferable that the movable comb-tooth portion is arranged at both one side and the other opposite side of the body portion of the object and that the fixed comb-tooth portion is each arranged corresponding to each movable comb-tooth portion.

In this case, the comb-tooth portion is arranged at both one side and the other opposite side of the body portion of the object. The fixed comb-tooth portion is each arranged corresponding to each movable comb-tooth portion.

Accordingly, because the movable comb-tooth portion is arranged at both one side and the other side, the drive force may be evenly applied to both directions of the one and the other sides of the body portion of the object.

It is preferable that the movable comb-tooth portion is arranged at both one side and the opposing other side of the holding portion of the object and that the fixed comb-tooth portion is each arranged corresponding to each movable comb-tooth portion.

In this case, the movable comb-tooth portion is arranged at both one side and the other side of the holding portion of the object. The fixed comb-tooth portion is each arranged corresponding to each movable comb-tooth portion.

Consequently, because the movable comb-tooth portion is formed at both one side and the other side of the holding portion of the object, the object may apply the drive force evenly to the one side and to the other side around the holding portion of the object.

According to anther aspect of the invention, which is an optical device having an actuator that drives an object, the actuator includes: a base section, the object having a body portion and a holding portion holding the body portion in a manner that the body portion is movable against the base section, a movable comb-tooth portion extending from the object side in a direction substantially perpendicular to a formation direction of the holding portion, and a fixed comb-tooth portion which extends from the base section in a direction substantially perpendicular to the formation direction of the holding portion and which is arranged at a position at which the fixed comb-tooth portion is engaged with but having a gap from the movable comb-tooth portion; the fixed comb-tooth portion being composed of a steady-voltage-receiving fixed comb tooth that steadily receives a drive voltage and a variable-voltage-receiving fixed comb tooth that receives a controlled voltage.

Consequently, by supplying the controlled voltage to the variable-voltage-receiving fixed comb tooth while steadily supplying the drive voltage to the steady-voltage-receiving fixed comb tooth, the movable comb-tooth portion may be attracted to the fixed comb-tooth portion by the electrostatic attraction, and, since the voltage is controlled when supplied, the drive force to be applied to the object and the movable comb-tooth portion may be freely controlled.

According to yet another aspect of the invention, a method for manufacturing the actuator includes: forming an object having a body portion and a holding portion holding the body portion in a manner that the body portion is movable against the base section, a movable comb-tooth portion extending from the object side in a direction substantially perpendicular to a formation direction of the holding portion, and a fixed comb-tooth portion which extends from the base section in a direction substantially perpendicular to the formation direction of the holding portion and which is arranged at a position at which the fixed comb-tooth portion is engaged with but having a gap from the movable comb-tooth portion, against an active layer of the base section including a base layer, an insulation layer formed on the base layer, and the active layer formed on the insulation layer; and forming a steady-voltage-receiving fixed comb tooth that steadily receives a drive voltage and a variable-voltage-receiving fixed comb tooth that receives a controlled voltage at the fixed comb-tooth portion by removing a laminated portion of the base layer and the insulation layer that corresponds to the object and the movable comb-tooth portion.

In this case, the object having the body portion and the holding portion, the movable comb-tooth portion, and the fixed comb-tooth portion are formed against the active layer of the base section. The object includes the body portion and the holding portion, and the holding portion is a portion that holds the body portion in such a manner that the body portion is movable against the base section. The movable comb-tooth portion extends from the object side in a direction substantially perpendicular to the formation direction of the holding portion. The fixed comb-tooth portion extends from the base section in a direction substantially perpendicular to the formation direction of the holding portion and is formed at the position at which the fixed comb-tooth portion is engaged with but having a gap from the movable comb-tooth portion.

By removing the laminated portion of the base layer and the insulation layer corresponding to the object and the movable comb-tooth portion, the steady-voltage-receiving fixed comb tooth that steadily receives the drive voltage and the variable-voltage-receiving fixed comb tooth that receives a controlled voltage are formed at the fixed comb-tooth portion.

As a consequence, the actuator such as the following may be manufactured. That is, by supplying the controlled voltage to the variable-voltage-receiving fixed comb tooth while steadily supplying the drive voltage to the steady-voltage-receiving fixed comb tooth, the movable comb-tooth portion may be attracted to the fixed comb-tooth portion by the electrostatic attraction, and, since the voltage is controlled when supplied, the drive force to be applied to the object and the movable comb-tooth portion may be freely controlled.

It is preferable that the method for manufacturing the actuator further includes: forming the movable comb-tooth portion extending from the body portion in order to move the body portion of the object two-dimensionally and arranging the fixed comb-tooth portion at a position at which the fixed comb-tooth portion is engaged with but having a gap from the movable comb-tooth portion.

In this case, the movable comb-tooth portion is formed extending from the body portion in order to move the body portion of the object two-dimensionally, and the fixed comb-tooth portion is arranged at the position at which the fixed comb-tooth portion is engaged with but having a gap from the movable comb-tooth portion.

Consequently, the body portion of the object and the movable comb-tooth portion may be two-dimensionally moved by the electrostatic attraction.

It is preferable that the method for manufacturing the actuator further includes: forming the movable comb-tooth portion extending from the holding portion in order to move the body portion of the object two-dimensionally and arranging the fixed comb-tooth portion at a position at which the fixed comb-tooth portion is engaged with but having a gap from the movable comb-tooth portion.

In this case, the movable comb-tooth portion is formed extending from the holding portion in order to move the body portion of the object two-dimensionally, and the fixed comb-tooth portion is arranged at the position at which the fixed comb-tooth portion is engaged with but having a gap from the movable comb-tooth portion.

Consequently, the body portion of the object and the movable comb-tooth portion may be two-dimensionally moved by the electrostatic attraction.

It is preferable that the method for manufacturing the actuator further includes: forming the movable comb-tooth portion extending from the body portion in order to move the body portion of the object two-dimensionally, forming another movable comb-tooth portion extending from the holding portion in order to rotate the object around the holding portion of the object, and arranging the fixed comb-tooth portion at a position at which the fixed comb-tooth portion is engaged with but having a gap from the movable comb-tooth portion.

In this case, the movable comb-tooth portion is formed extending from the body portion in order to move the body portion of the object two-dimensionally; another movable comb-tooth portion is formed extending from the holding portion in order to rotate the object around the holding portion of the object; and the fixed comb-tooth portion is arranged at the position at which the fixed comb-tooth portion is engaged with but having a gap from the movable comb-tooth portion.

Consequently, the body portion of the object and the movable comb-tooth portion may be two-dimensionally moved by the electrostatic attraction. Further, the body portion of the object and the movable comb-tooth portion may be rotated around the holding portion of the object by the rotational force.

It is preferable that the method for manufacturing the actuator further includes: alternately aligning at least one steady-voltage-receiving fixed comb tooth and at least one variable-voltage-receiving fixed comb tooth with a gap therebetween.

In this case, at least one steady-voltage-receiving fixed comb tooth and at least one variable-voltage-receiving fixed comb tooth are alternately aligned with a gap therebetween.

Consequently, even when the controlled voltage is applied to the variable-voltage-receiving fixed comb tooth, the electrostatic attraction may be generated uniformly as a whole between the fixed comb-tooth portion and the movable comb-tooth portion.

BRIEF DESCRIPTION OF THE DRAWINGS

The invention will be described with reference to the accompanying drawings, wherein like numbers reference like elements.

DESCRIPTION OF THE EMBODIMENTS

Embodiments of the invention will now be described with reference to the drawings.

Preferred Embodiment 1

Figure 1:
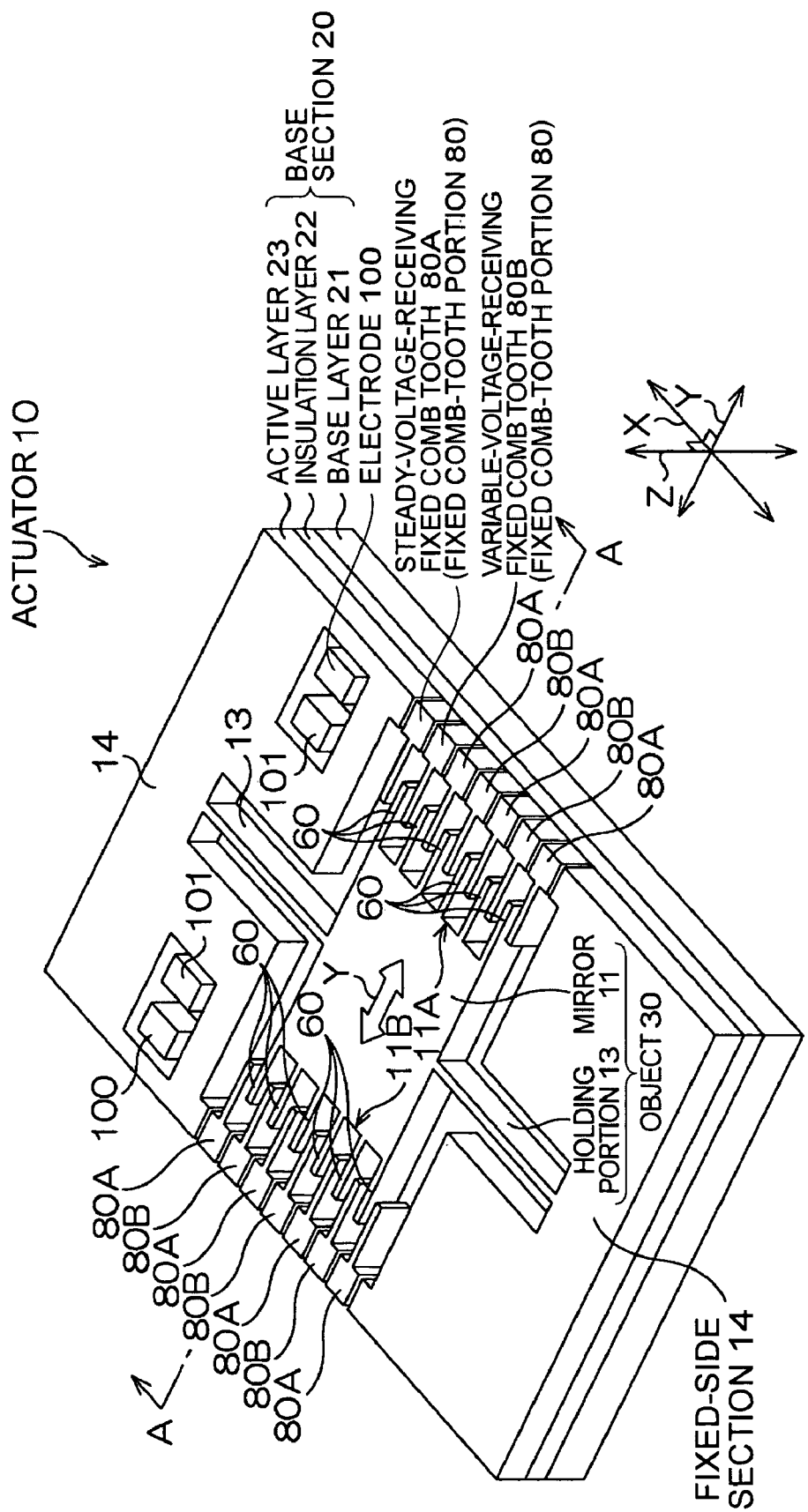
FIG. 1 is a perspective diagram illustrating a preferred embodiment of an actuator of one aspect of the invention, which is also an actuator obtained by a preferred embodiment of a manufacturing method of another aspect of the invention.
Figure 2:
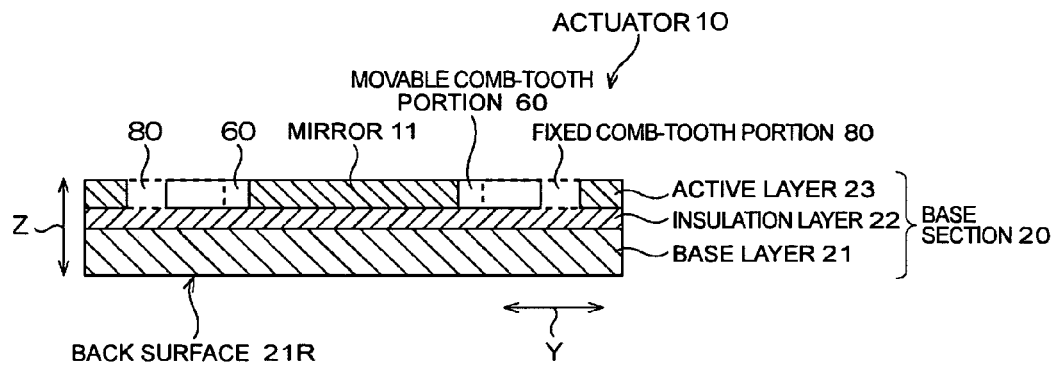
FIG. 2 is a diagram of an exemplary cross-sectional structure taken on line A-A of FIG. 1, showing a manufacturing process in progress.
Figure 3:
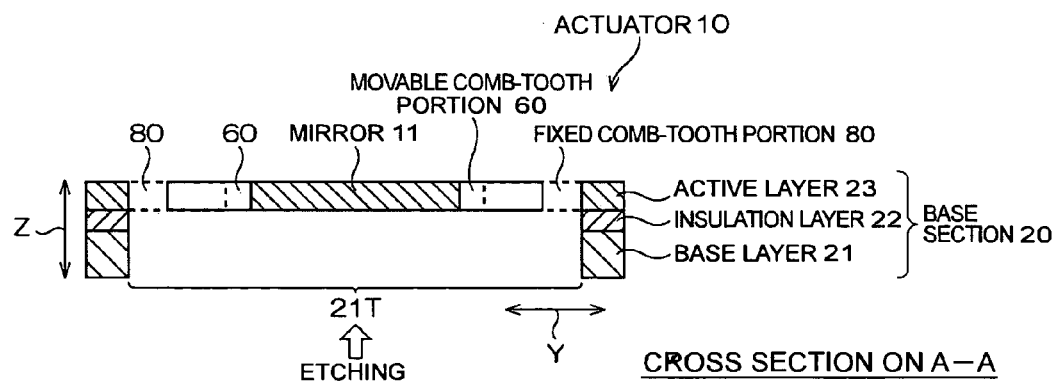
FIG. 3 is a diagram of the exemplary cross-sectional structure taken on line A-A of FIG. 1, as it has been manufactured.

FIG. 1 is a perspective diagram illustrating a preferred embodiment of the actuator of one aspect of the present invention, which is also one preferred example of the actuator obtained by a preferred embodiment of the manufacturing method of another aspect of the invention. FIGS. 2 and 3 illustrate an exemplary cross-sectional structure of an actuator 10 taken on line A-A of FIG. 1, in that FIG. 2 shows a progressing process for manufacturing the actuator 10, and FIG. 3 shows the manufactured actuator 10.

Referring to FIG. 1, the exemplary structure of the actuator 10 will be described.

The actuator 10 is to drive a mirror 11. This actuator 10 can be called a perpendicular comb-tooth actuator, which drives the mirror 11 using electrostatic attraction. The perpendicular comb-tooth actuator can have a high driving torque, have no restriction on the deflection angle, have a much simpler structure than that of, for example, the electromagnetic actuator, and is thus easier to manufacture.

The actuator 10 schematically includes a base section 20, an object 30, movable comb-tooth portions 60, and fixed comb-tooth portions 80.

As shown in FIGS. 1 and 2, the base section 20 is a laminated body formed by laminating a base layer 21, an insulation layer 22, and an active layer 23. This base section 20 can also be called a substrate and can be, for example, a silicon-on-insulator (SOI) substrate.

For the base layer 21, a Si substrate can be used. The insulation layer 22 is formed between the base layer 21 and the active layer 23, electrically insulating the two. The object 30, the movable comb-tooth portions 60, and the fixed comb-tooth portions 80 are made by using the active layer 23. For example, these object 30, movable comb-tooth portions 60, and fixed comb-tooth portions 80 can be formed by dry-etching the active layer 23 using a resist film. In addition, a plurality of electrodes 100 and 101 are formed at the active layer 23.

In FIG. 1, two-dimensional directions of the base section 20 and the mirror 11 are composed of X and Y directions. A Z direction is a direction perpendicular to the base section 20. The X, Y, and Z directions are perpendicular to each other.

The object 30 is formed using the active layer 23 and includes the mirror 11 and holding portions 13 and 13. Two end portions of the mirror 11 are held against a fixed-side section 14 by the holding portions 13 and 13. The holding portion 13 is rectangular in cross section and can also be called a bar. The mirror 11 is equivalent to the body portion of the object.

The actuator 10 in FIG. 1 has a function of moving the mirror 11 in the Y direction in the X and Y dimensions.

On one side 11A and the other side 11B of the mirror 11, a plurality of movable comb-tooth portions 60 are formed, with each of them protruding in directions opposite from each other. The movable comb-tooth portions 60 are protruding in parallel and having a gap from each other. The protrusion direction of the movable comb-tooth portions 60 is the Y direction, perpendicular or substantially perpendicular to the longitudinal direction of the holding portion 13. The two holding portions 13 are formed in the X direction. The movable comb-tooth portions 60 are protruding with a predetermined gap from each other, aligned between the gaps in the X direction.

Figure 4:
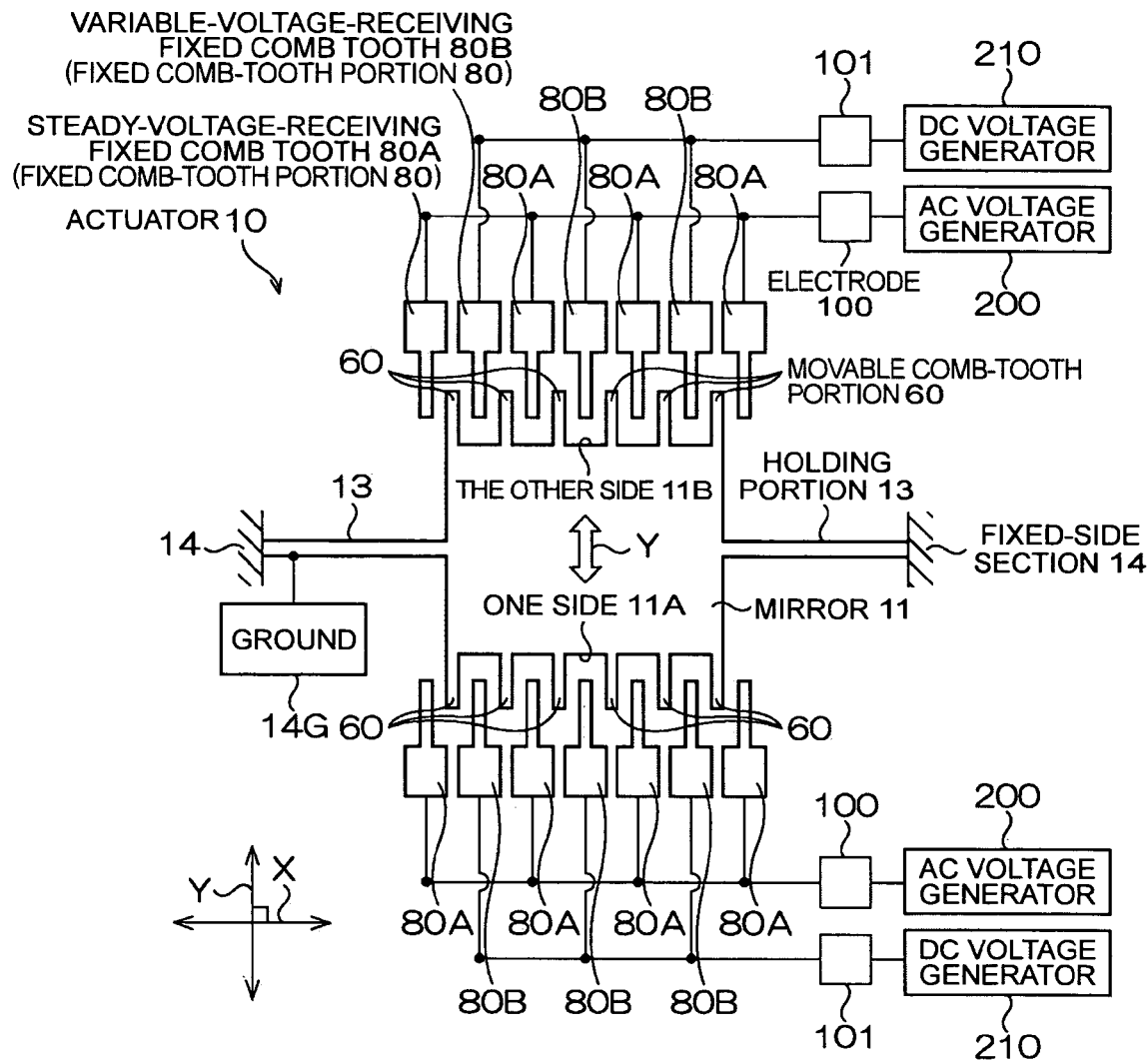
FIG. 4 is a diagram illustrating elements of the actuator of FIG. 1 and their exemplary electrical connection.

FIG. 4 shows an example of the movable comb-tooth portions 60 formed in the X direction and protruding between the predetermined gaps. The mirror 11 and the holding portions 13 are connected to a ground 14G together with the fixed-side section 14. Each of the movable comb-tooth portions 60 is a rectangular member, for example. In the drawing, for example, there are six movable comb-tooth portions 60 at both one and the other sides 11A and 11B of the mirror 11.

In contrast, the fixed comb-tooth portions 80 in FIG. 4 are arranged opposite from the movable comb-tooth portions 60 and 60 on both sides. The fixed comb-tooth portions 80 are composed of steady-voltage-receiving fixed comb teeth 80A and variable-voltage-receiving fixed comb teeth 80B. In the example shown in FIGS. 1 and 4, the steady-voltage-receiving fixed comb teeth 80A and the variable-voltage-receiving fixed comb teeth 80B are alternately aligned one by one.

The steady-voltage-receiving fixed comb teeth 80A and the variable-voltage-receiving fixed comb teeth 80B are aligned at positions at which they are alternately engaged with but having a gap from the movable comb-tooth portions 60. Therefore, the steady-voltage-receiving fixed comb teeth 80A and variable-voltage-receiving fixed comb teeth 80B are each formed in the Y direction, protruding towards the mirror 11 side. The direction of the steady-voltage-receiving fixed comb teeth 80A and the variable-voltage-receiving fixed comb teeth 80B is the direction substantially perpendicular to the longitudinal direction of the holding portions 13.

The steady-voltage-receiving fixed comb teeth 80A in FIG. 4 are coupled via the electrode 100, for example, to an alternate current (AC) voltage generator 200 which is, for example, a steady voltage generator. The variable-voltage-receiving fixed comb teeth 80B are electrically coupled to a direct current (DC) voltage generator 210 via the electrode 101. The DC voltage generator 210 is used for fine adjustment of the drive force and has a function of supplying the adjusted voltage only to the variable-voltage-receiving fixed comb teeth 80B.

Consequently, the fixed comb-tooth portions 80 composed of the steady-voltage-receiving fixed comb teeth 80A and the variable-voltage-receiving fixed comb teeth 80B have the following advantage. That is, by carrying current from the AC voltage generator 200 to the steady-voltage-receiving fixed comb teeth 80A, the electrostatic attraction is generated between the steady-voltage-receiving fixed comb teeth 80A and the movable comb-tooth portions 60 so as to move the mirror 11 in the Y direction. In this case, by adjusting the voltage that the DC voltage generator 210 supplies to the variable-voltage-receiving fixed comb teeth 80B, the fine adjustment of the two-dimensional drive force of this mirror 11 in the Y direction, that is, of the electrostatic attraction between the variable-voltage-receiving fixed comb teeth 80B and the movable comb-tooth portions 60, can be readily and reliably conducted.

Figure 5:
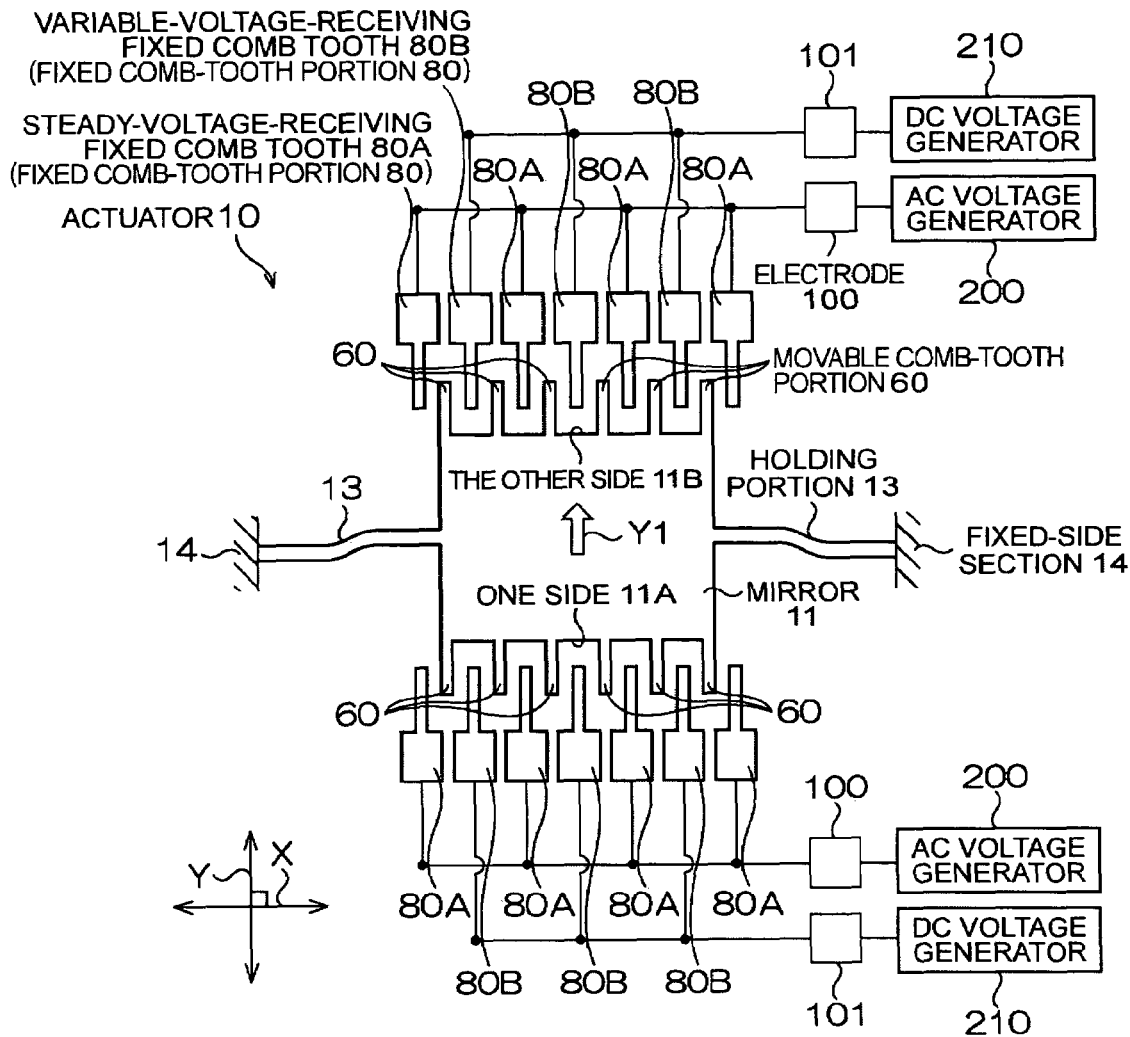
FIG. 5 is a diagram illustrating an example of two-dimensional movement of a mirror in the connection example of FIG. 4.

FIG. 4 shows a situation in which current is not carried to the comb tooth of each fixed comb-tooth portion 80. FIG. 5 shows an example in that the steady voltage is supplied to the steady-voltage-receiving fixed comb teeth 80A and that the adjusted voltage is supplied to the variable-voltage-receiving fixed comb teeth 80B, with the mirror 11 is moving in the Y direction. In this case, the holding portions 13 are elastically deformed due to the movement of the mirror 11.

A preferred example of the method for manufacturing the actuator 10 will now be described with reference to FIGS. 2 and 3.

As shown in FIGS. 2 and 1, the base section 20 is prepared, and the object 30, the movable comb-tooth portions 60, the fixed comb-tooth portions 80, and the electrodes 100 and 101 are formed against the active layer 23 of this base section 20.

Then, as shown in FIG. 3, a region 21T including the base layer 21 is etched and removed from a rear surface 21R side of the base layer 21. The region 21T removed from this base layer 21 is a region corresponding to the movable comb-tooth portions 60 and the object 30 of FIG. 1. By thus removing the region 21T, the movable comb-tooth portions 60 and the object 30 are relieved from the restraint of the base layer 21 and can move freely against the base section 20. If necessary, with a region corresponding to the fixed comb-tooth portions 80, also, the corresponding base layer 21 and the insulation layer 22 can be removed.

The actuator 10 shown in FIG. 1 can two-dimensionally move the mirror 11 in the Y direction. By increasing the voltage to be supplied from the DC voltage generator 20 to the variable-voltage-receiving fixed comb teeth 80B shown in FIG. 4, the electrostatic attraction between the fixed comb-tooth portions 80 and the movable comb-tooth portions 60 can be increased, and the drive force can be thereby increased. Further, in contrast, the drive force can be reduced by reducing the voltage to be applied to the variable-voltage-receiving fixed comb teeth 80B.

Preferred Embodiment 2

Figure 6:
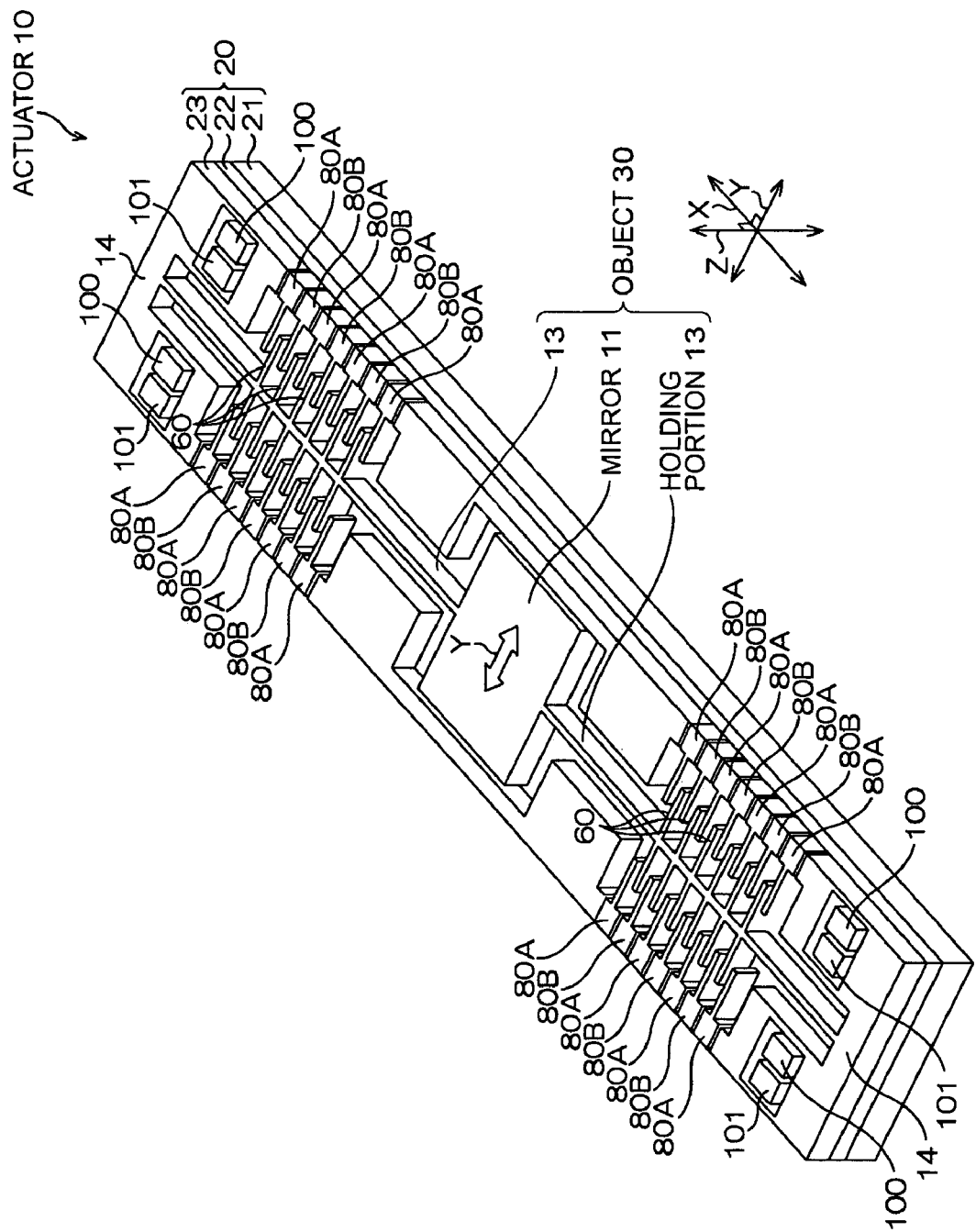
FIG. 6 is a perspective diagram illustrating the actuator of another embodiment of one aspect of the invention, which is also the actuator obtained by the manufacturing method of another aspect of the invention.
Figure 7:
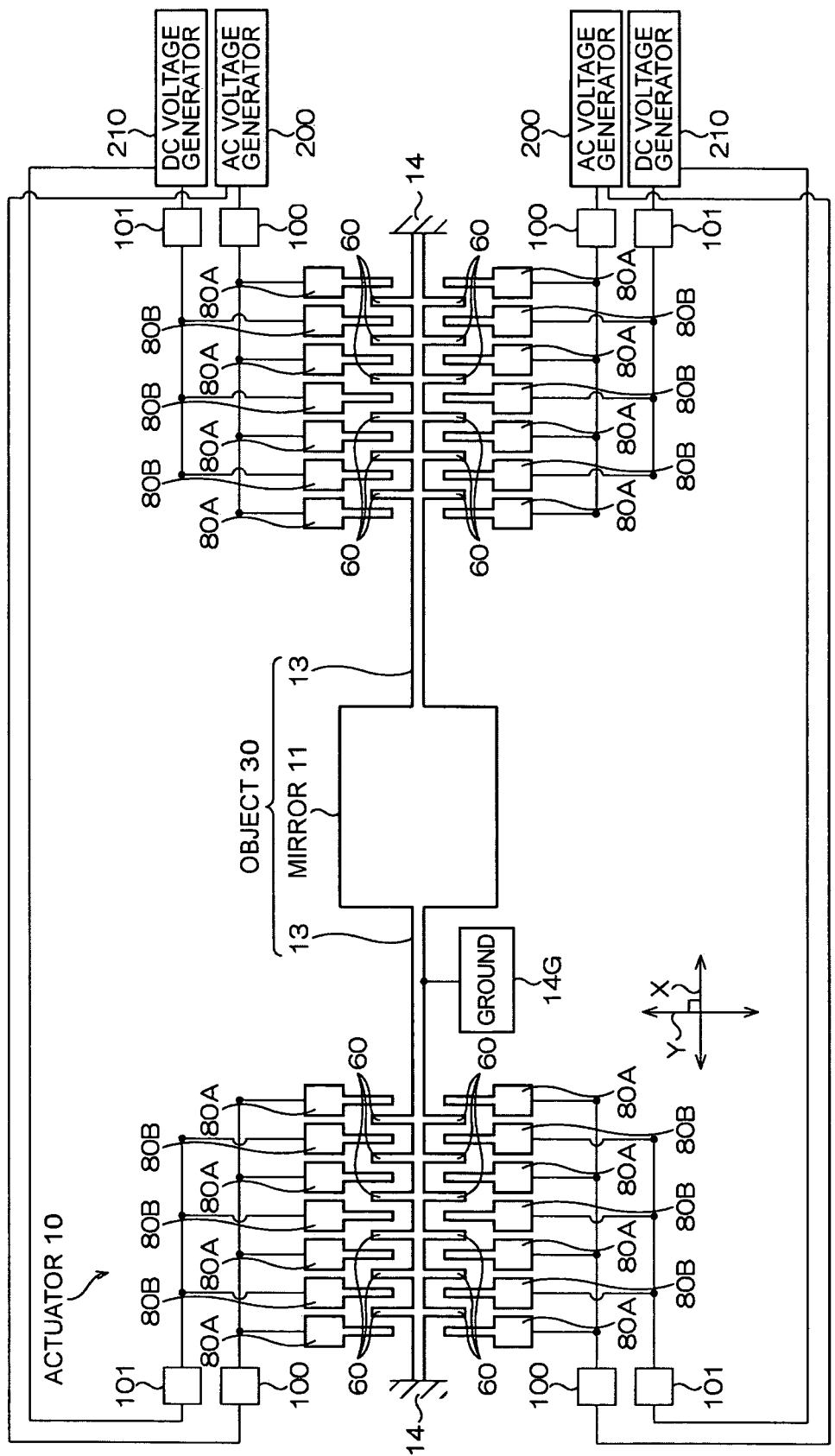
FIG. 7 is a plan diagram illustrating an exemplary electrical wiring of the embodiment shown in FIG. 6.

FIGS. 6 and 7 show a preferred embodiment 2 of one aspect of the invention, which is also an example of another actuator obtained by the manufacturing method of the preferred embodiment of another aspect of the invention. FIG. 6 is a perspective diagram showing a configuration of the actuator 10, and FIG. 7 is a plan diagram showing an example of wiring of the actuator 10.

The actuator 10 shown in FIGS. 6 and 7 includes the base section 20 containing the insulation layer 22 and the active layer 23. Where the constituent elements of the actuator shown in FIGS. 6 and 7 are substantially the same as those of the actuator 10 shown in FIG. 1, the same reference numbers are used for their descriptions.

A characteristic aspect of the actuator 10 shown in FIGS. 6 and 7 is that the mirror 11 of the object 30 is held against the fixed-side section 14 by the holding portions 13 and 13. These holding portions 13 and 13 can be called torsion bars.

At each of the holding portions 13 and 13, the movable comb-tooth portions 60 are formed and protruding. On one side of one holding portion 13, six movable comb-tooth portions 60 are formed and protruding, for example. On the other side, also, six movable comb-tooth portions 60 are formed and protruding. The same structure applies to the other opposite holding portion 13.

The direction of each movable comb-tooth portion 60 is a direction substantially perpendicular to the longitudinal direction of the holding portion 13. The holding portion 13 is formed in the X direction, and each movable comb-tooth portion 60 is formed protruding in the Y direction.

The steady-voltage-receiving fixed comb teeth 80A and the variable-voltage-receiving fixed comb teeth 80B of the fixed comb-tooth portions are alternately formed so as to correspond to these movable comb-tooth portions 60. Similarly to the example of the embodiment FIG. 1, the steady-voltage-receiving fixed comb teeth 80A and the variable-voltage-receiving fixed comb teeth 80B are formed protruding, engaged with their corresponding movable comb-tooth portions 60, and each having a gap from each other.

The steady-voltage-receiving fixed comb teeth 80A of the fixed comb-tooth portion 80 are coupled to the AC voltage generator 200 via the electrodes 100. Likewise, the variable-voltage-receiving fixed comb teeth 80B are coupled to the DC voltage generator 210 via the electrode 101. The mirror 11 and the holding portions 13 of the object 30 are coupled to the ground 14G.

In the example of FIGS. 6 and 7, the mirror 11 can be, for example, two-dimensionally moved in the Y direction by applying the steady voltage to the steady-voltage-receiving fixed comb teeth 80A while applying the controlled voltage to the variable-voltage-receiving fixed comb teeth 80B.

In this case, the movable comb-tooth portions 60 are formed against the holding portions 13 and 13, and the fixed comb-tooth portions 80 are arranged corresponding to the movable comb-tooth portions 60. It is particularly effective to form the movable comb-tooth portions 60 against the holding portions 13 and 13 if the mirror 11 is small in size and the movable comb-tooth portions 60 cannot be formed directly to the one and the other sides of the mirror 11.

In the embodiments of FIGS. 1 and 6, because the movable comb-tooth portions 60 and the fixed comb-tooth portions 80 are aligned in the same dimension with no irregularity in the Z direction as shown in FIG. 2, the rotational torque is not generated at the time of the movement of the mirror 11.

Preferred Embodiment 3

Figure 8:
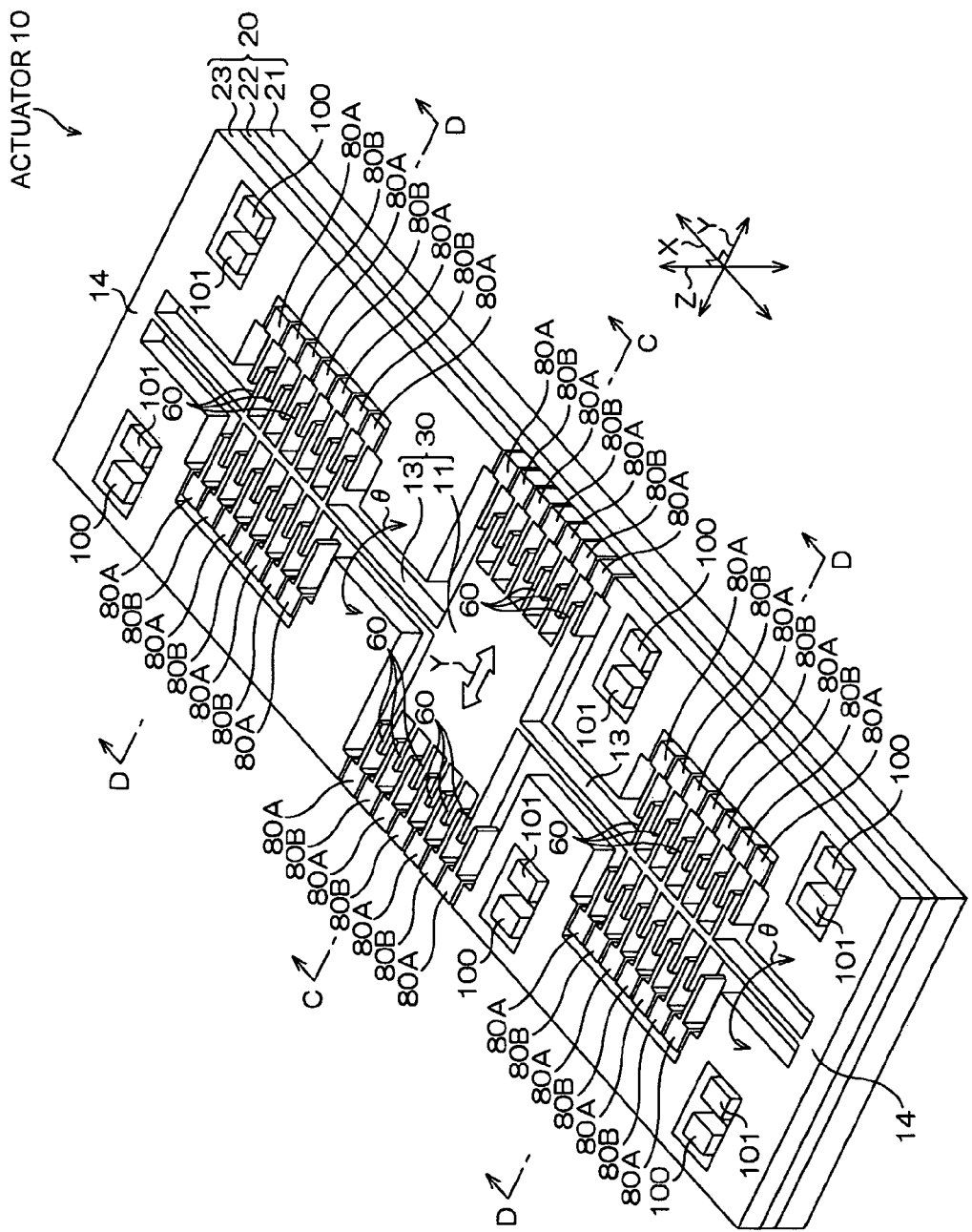
FIG. 8 is a perspective diagram illustrating the actuator of yet another embodiment of one aspect of the invention, which is also the actuator obtained by the manufacturing method of another aspect of the invention.
Figure 9:
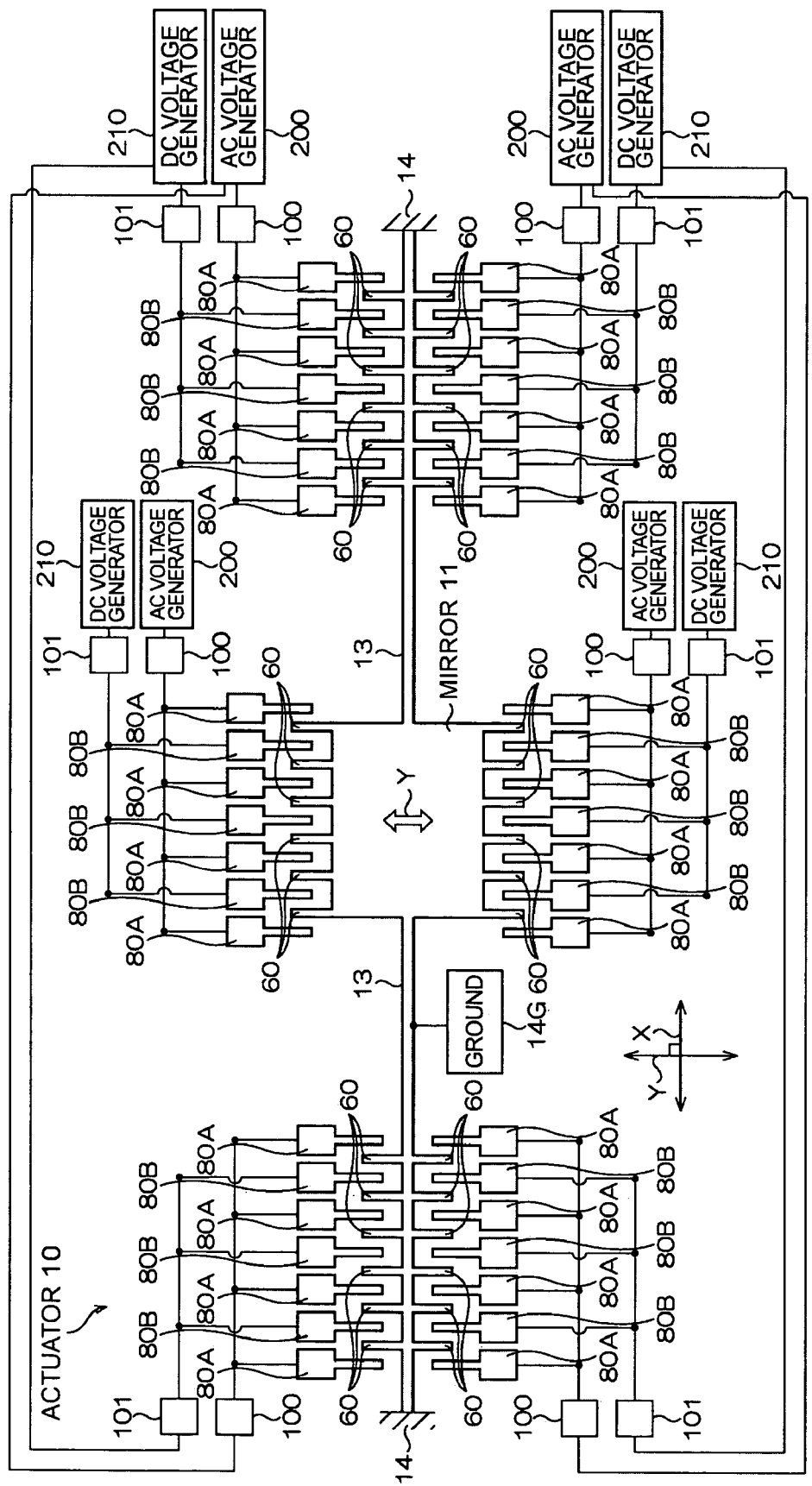
FIG. 9 is a diagram illustrating an exemplary electrical connection of the actuator of FIG. 8.

FIGS. 8 and 9 show yet another preferred embodiment of one aspect of the invention, which is also yet another example of the actuator obtained by the manufacturing method of the preferred embodiment of another aspect of the invention. FIG. 8 is a perspective diagram showing a configuration of the actuator 10, and FIG. 9 is a plan diagram showing an exemplary wiring structure of the actuator 10 of FIG. 8. Where the constituent elements of the actuator shown in FIGS. 8 and 9 are substantially the same as those of the actuator 10 shown in FIGS. 1 and 6, the same reference numbers are used for their descriptions.

The actuator 10 shown in FIGS. 8 and 9 is structured not only to drive the mirror 11 two-dimensionally in the Y direction but also to enable the mirror 11 to rotate in a θ direction.

That is, the actuator 10 can not only drive the mirror of the object 30 two-dimensionally in the Y direction but also rotate the mirror around the holding portions 13 and 13 in the θ direction.

The mirror 11, the holding portions 13, and the steady-voltage-receiving fixed comb teeth 80A and the variable-voltage-receiving fixed comb teeth 80B of the movable comb-tooth portions 60 and their nearby fixed comb-tooth portions 80 of the mirror 11 have the same structures and operations as those in the embodiment of FIG. 1, and, thus, the same descriptions thereof are used.

A characteristic feature of the actuator 10 of FIG. 8 is its structure, in which the movable comb-tooth portions 60 and 60, the steady-voltage-receiving fixed comb teeth 80A, and the variable-voltage-receiving fixed comb teeth 80B are arranged corresponding to the holding portions 13 and 13.

Figure 10:
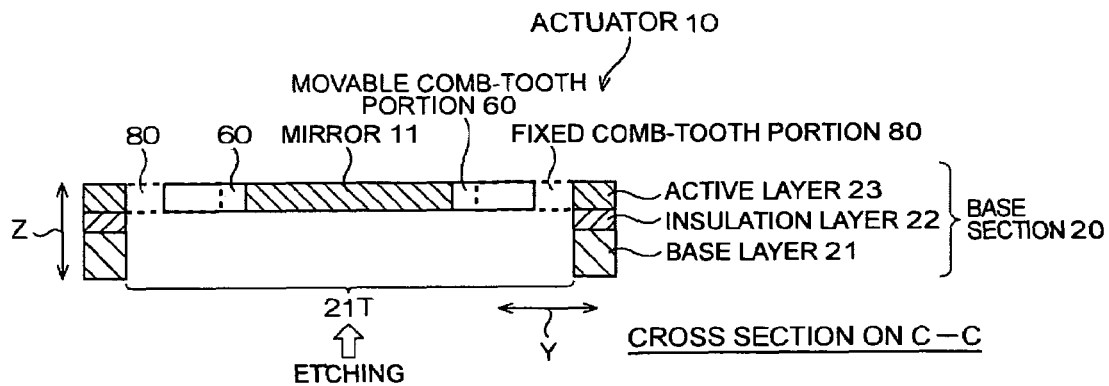
FIG. 10 is a diagram illustrating an exemplary cross-sectional structure taken on line C-C of FIG. 8.
Figure 11:
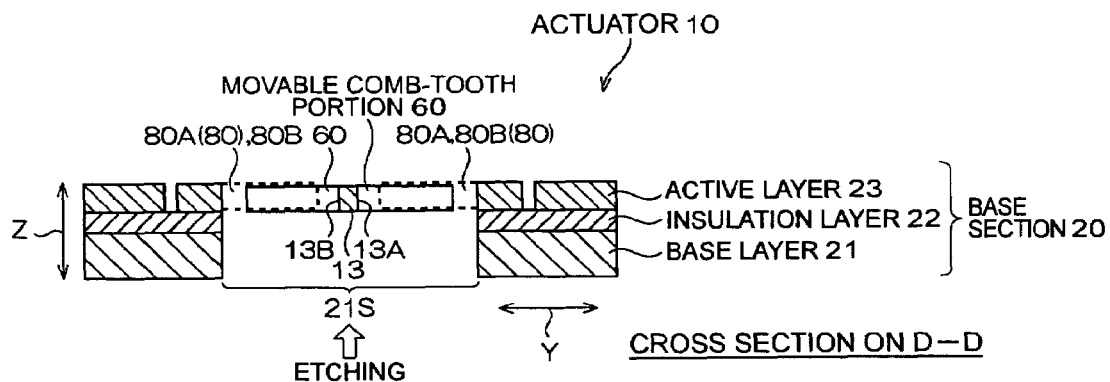
FIG. 11 is a diagram illustrating the exemplary cross-sectional structure taken on line D-D of FIG. 8.

FIG. 10 shows an exemplary cross-sectional structure taken on line C-C of FIG. 8, and FIG. 11 shows an exemplary cross-sectional structure of the actuator 10 taken on line D-D of FIG. 8. As shown in FIG. 10, in the exemplary cross-sectional structure around the mirror 11, a portion in the region 21T of the base layer 21 and the insulation layer 22 that corresponds to the movable comb-tooth portions 60 and the mirror 11 is completely removed.

In contrast, as shown in FIG. 11, at the region around the holding portion 13, a region 21S of the base layer 21 and the insulation layer 22 is etched and removed. This region 21S is narrower than the region 21T of FIG. 10. Further, the movable comb-tooth portions 60 and 60 are formed protruding in opposite directions in the Y direction at both one side 13A and the other side 13B of the holding portion 13. These movable comb-tooth portions 60 and 60 are dislocated in the Z direction from the steady-voltage-receiving fixed comb teeth 80A and variable-voltage-receiving fixed comb teeth 80B of the corresponding fixed comb-tooth portions 80.

Figure 12:
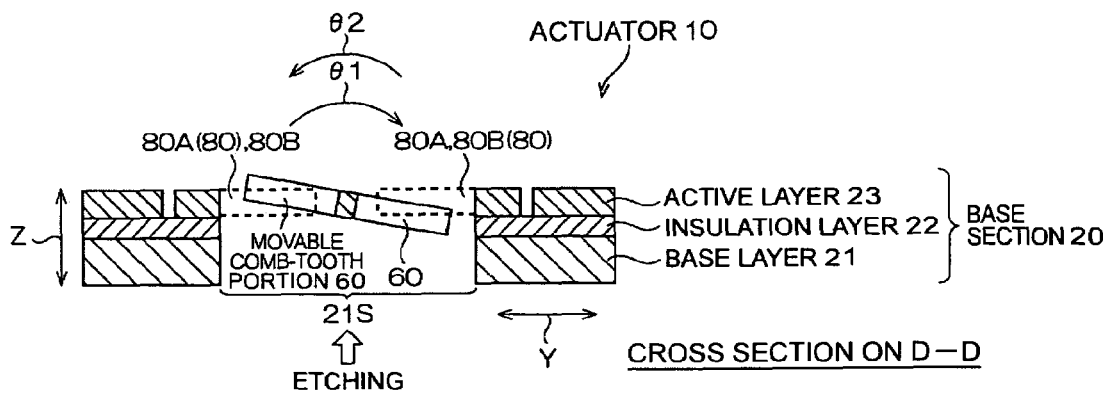
FIG. 12 is a diagram illustrating a situation in which a holding portion is rotated.

Accordingly, by dislocating the movable comb-tooth portions 60 from the fixed comb-tooth portions 80 in the Z direction and by supplying the steady voltage to the steady-voltage-receiving fixed comb teeth 80A while supplying the controlled voltage to the variable-voltage-receiving fixed comb teeth 80B, the electrostatic attraction is generated between the movable comb-tooth portions 60 and the fixed comb-tooth portions 80. As shown in FIG. 12, however, the holding portion 13 can be rotated in a θ1 direction, for example. Alternatively, the holding portion 13 can be rotated in a θ2 direction. Thus, the mirror 11 can generate not only the planar drive in the Y direction but also the rotational drive in the θ1 and θ2 directions.

Further, by applying the rotation system of the holding portions 13 and 13 in FIG. 8 to the actuator 10 of FIG. 6, the actuator 10 of FIG. 6 is naturally capable of only rotating the mirror 11 without moving the mirror 11 two-dimensionally in the Y direction.

Each embodiment of the actuator of one aspect of the invention is manufactured by the actuator manufacturing method as shown in FIGS. 2 and 3.

Figure 13:
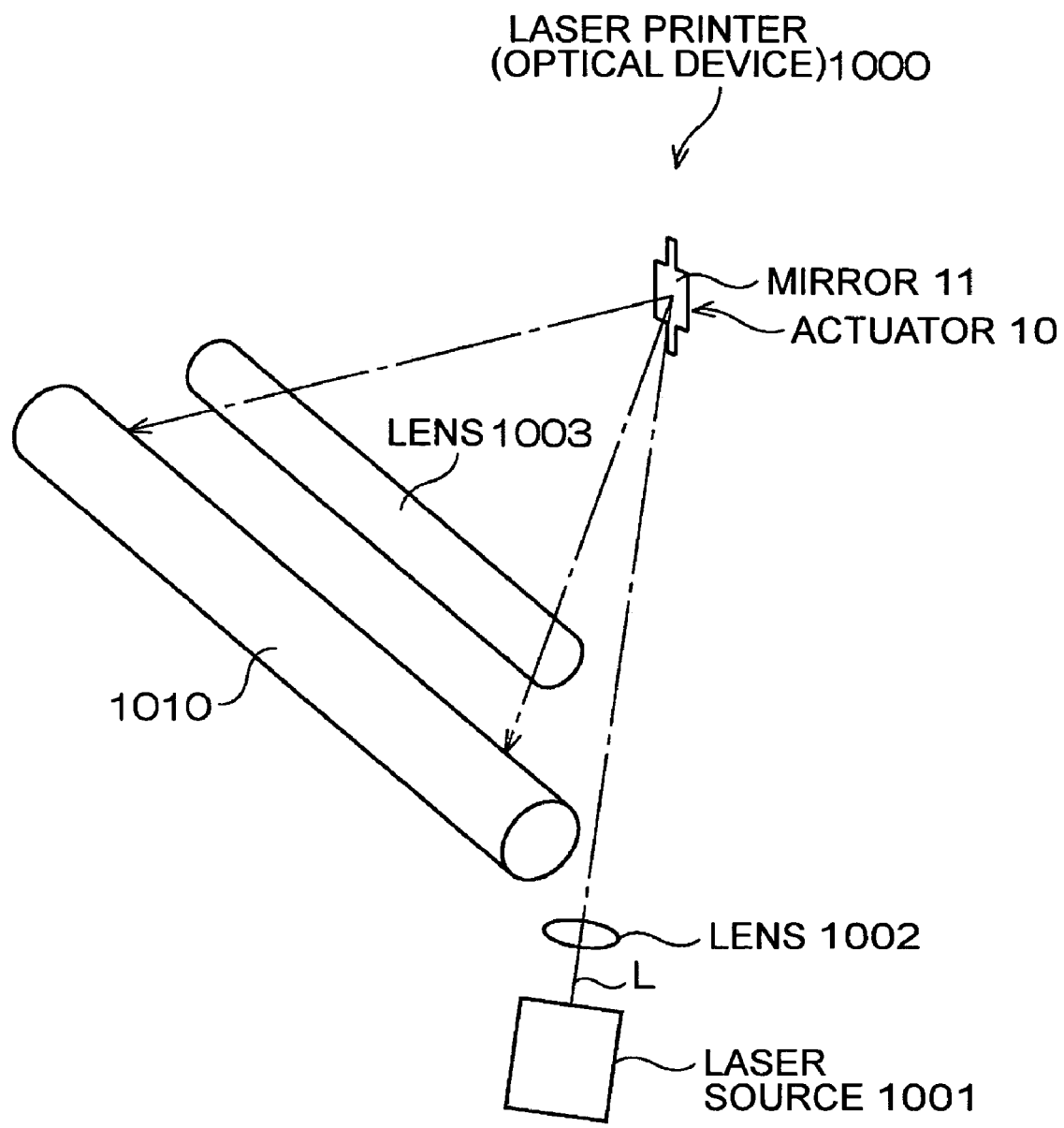
FIG. 13 is a diagram illustrating a laser printer, which is one example of an optical device employing the embodiment of the actuator of one aspect of the invention.

FIG. 13 illustrates an application example of the actuator 10 of one aspect of the invention, showing a laser printer 1000 as one example of the optical device provided with the actuator 10.

The laser printer 1000 includes a laser source 1001, lenses 1002 and 1003, the actuator 10, and a photoreceptor 1010. A laser light L of the laser source 1001 reflects by the mirror 11 of the actuator 10 through the lens 1002. By rotating the actuator 10, for example, the laser light L can be one-dimensionally scanned against the photoreceptor 1010 through the lens 1003. The scanned laser light L forms an electrostatic latent image in order to form an image on the photoreceptor 1010.

The optical device having the actuator of one aspect of the invention is by no means limited to the laser printer but can be a projector, a bar code reader, or the like. For the projector, there are a rear projection type and a direct projection type.

In each embodiment of the invention, the fixed comb-tooth portions 80 include the steady-voltage-receiving fixed comb teeth 80A and the variable-voltage-receiving fixed comb teeth 80B. As shown in FIG. 4, for example, the steady-voltage-receiving fixed comb teeth 80A and the variable-voltage-receiving fixed comb teeth 80B are alternately aligned one by one. However, the number of the steady-voltage-receiving fixed comb teeth 80A and the variable-voltage-receiving fixed comb teeth 80B to be aligned may certainly be more than two.

The number of the fixed comb-tooth portions 80 and the number of the movable comb-tooth portions 60 are not limited to those shown in the drawings.

Although the predetermined DC voltage is supplied to the variable-voltage-receiving fixed comb teeth 80B from the DC voltage generator 210, a predetermined AC voltage may be supplied thereto. Also, it is also certainly possible that the voltage is not supplied to the variable-voltage-receiving fixed comb teeth 80B from the DC voltage generator or the AC voltage generator.

It is also naturally possible that, by supplying the same voltage to both of the steady-voltage-receiving fixed comb teeth 80A and variable-voltage-receiving fixed comb teeth 80B, the comb teeth 80A and 80B can be used in the same manner as the conventionally-used fixed comb-tooth portions. Also, by applying the DC voltage to the variable-voltage-receiving fixed comb teeth 80A to give them the function of an electric spring, the amplitude of the movable comb-tooth portions 60 during the operation can be controlled. By increasing the voltage to be applied to the variable-voltage-supplying fixed comb teeth 80B, the drive force of the movable comb-tooth portions 60 and the mirror 11 can be increased, while the drive force of the movable comb-tooth portions 60 and the mirror 11 can be decreased by decreasing the voltage to be applied to the variable-voltage-supplying fixed comb teeth 80B. In the embodiments of the invention, by partly changing the voltage to be applied to the fixed comb teeth, the variability of the drive force and the amplitude (deviation) of the object can be controlled. Further, pertaining to the base section 20, the active layer 23 may be formed by forming polysilicon on the insulation layer 22.

Although the mirror 11 is exemplified as the object moved by the actuator 10 in the embodiments of the invention, the actuator of one aspect of the invention may be also used to drive other elements.

The invention is not limited to the above-described embodiments and can be modified within the claims of the invention.

Some of the elements in each of the embodiments may be omitted or arbitrarily combined so as to be different from the foregoing descriptions.

What is claimed is:

1. An actuator, comprising:
   a base section;
   an object having a body portion and a holding portion holding the body portion in a manner that the body portion is movable against the base section, the body portion and the holding portion being integrally formed with the base section;
   a movable comb-tooth portion extending from the object side in a direction substantially perpendicular to a formation direction of the holding portion; and
   a fixed comb-tooth portion which extends from the base section in a direction substantially perpendicular to the formation direction of the holding portion and which is arranged at a position at which the fixed comb-tooth portion is engaged with but having a gap from the movable comb-tooth portion;
   the fixed comb-tooth portion being composed of each of steady-voltage-receiving fixed comb teeth that steadily receive a drive voltage and variable-voltage-receiving fixed comb teeth that receive a controlled voltage, the steady-voltage-receiving fixed comb teeth alternating with the variable-voltage-receiving fixed comb teeth along a length of the base section such that each variable-voltage-receiving fixed comb tooth is disposed between a pair of steady-voltage-receiving fixed comb teeth.

2. The actuator according to claim 1, wherein:
   the movable comb-tooth portion is formed extending from the body portion in order to move the body portion of the object two-dimensionally; and
   the fixed comb-tooth portion is arranged at a position at which the fixed comb-tooth portion is engaged with but having a gap from the movable comb-tooth portion.

3. The actuator according to claim 2, wherein:
   the movable comb-tooth portion is arranged at both one side and the other opposite side of the body portion of the object; and
   the fixed comb-tooth portion is each arranged corresponding to each movable comb-tooth portion.

4. The actuator according to claim 1, wherein:
   the movable comb-tooth portion is formed extending from the holding portion in order to move the body portion of the object two-dimensionally; and
   the fixed comb-tooth portion is arranged at a position at which the fixed comb-tooth portion is engaged with but having a gap from the movable comb-tooth portion.

5. The actuator according to claim 4, wherein:
the movable comb-tooth portion is arranged at both one side and the other opposite side of the holding portion of the object; and
the fixed comb-tooth portion is each arranged corresponding to each movable comb-tooth portion.

6. The actuator according to claim 1, wherein
the movable comb-tooth portion is formed extending from the body portion in order to move the body portion of the object two-dimensionally;
another movable comb-tooth portion is formed extending from the holding portion in order to rotate the object around the holding portion of the object; and
the fixed comb-tooth portion is arranged at a position at which the fixed comb-tooth portion is engaged with but having a gap from the movable comb-tooth portion.

7. The actuator according to claim 1, wherein a direct current voltage is applied to the variable-voltage-receiving fixed comb tooth.

8. An optical device having an actuator that drives an object, wherein:
the actuator includes:
a base section;
the object having a body portion and a holding portion holding the body portion in a manner that the body portion is movable against the base section, the body portion and the holding portion being integrally formed with the base section;
a movable comb-tooth portion extending from the object side in a direction substantially perpendicular to a formation direction of the holding portion; and
a fixed comb-tooth portion which extends from the base section in a direction substantially perpendicular to the formation direction of the holding portion and which is arranged at a position at which the fixed comb-tooth portion is engaged with but having a gap from the movable comb-tooth portion;
the fixed comb-tooth portion being composed of steady-voltage-receiving fixed comb teeth that steadily receive a drive voltage and variable-voltage-receiving fixed comb teeth that receive a controlled voltage, the steady-voltage-receiving fixed comb teeth alternating with the variable-voltage-receiving fixed comb teeth along a length of the base section such that each variable-voltage-receiving fixed comb tooth is disposed between a pair of steady-voltage-receiving fixed comb teeth.

9. A method for manufacturing an actuator, comprising:
integrally forming an object having a body portion and a holding portion with a base section such that the holding portion holds the body portion in a manner that the body portion is movable against the base section, a movable comb-tooth portion extending from the object side in a direction substantially perpendicular to a formation direction of the holding portion, and a fixed comb-tooth portion which extends from the base section in a direction substantially perpendicular to the formation direction of the holding portion and which is arranged at a position at which the fixed comb-tooth portion is engaged with but having a gap from the movable comb-tooth portion, against an active layer of the base section including a base layer, an insulation layer formed on the base layer, and the active layer formed on the insulation layer; and
forming steady-voltage-receiving fixed comb teeth that steadily receive a drive voltage and forming variable-voltage-receiving fixed comb teeth that receive a controlled voltage at the fixed comb-tooth portion by removing a laminated portion of the base layer and the insulation layer that corresponds to the object and the movable comb-tooth portion;
wherein forming the steady-voltage-receiving fixed comb teeth and the variable-voltage-receiving fixed comb teeth includes alternating the steady-voltage-receiving fixed comb teeth and the variable-voltage-receiving fixed comb teeth along a length of the base section such that each variable-voltage-receiving fixed comb tooth is disposed between a pair of steady-voltage-receiving fixed comb teeth.

10. The method for manufacturing the actuator according to claim 9, further comprising:
forming the movable comb-tooth portion extending from the body portion in order to move the body portion of the object two-dimensionally; and
arranging the fixed comb-tooth portion at a position at which the fixed comb-tooth portion is engaged with but having a gap from the movable comb-tooth portion.

11. The method for manufacturing the actuator according to claim 9, further comprising:
forming the movable comb-tooth portion extending from the holding portion in order to move the body portion of the object two-dimensionally; and
arranging the fixed comb-tooth portion at a position at which the fixed comb-tooth portion is engaged with but having a gap from the movable comb-tooth portion.

12. The method for manufacturing the actuator according to claim 9, further comprising forming the movable comb-tooth portion extending from the body portion in order to move the body portion of the object two-dimensionally, forming another movable comb-tooth portion extending from the holding portion in order to rotate the object around the holding portion of the object, and arranging the fixed comb-tooth portion at a position at which the fixed comb-tooth portion is engaged with but having a gap from the movable comb-tooth portion.

* * * * *